(12) United States Patent
Li

(10) Patent No.: US 10,818,735 B2
(45) Date of Patent: Oct. 27, 2020

(54) ORGANIC LIGHT-EMITTING DISPLAY PANEL AND DISPLAY DEVICE

(71) Applicant: WuHan TianMa Micro-Electronics Co., Ltd., Wuhan (CN)

(72) Inventor: Bo Li, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 43 days.

(21) Appl. No.: 16/215,909

(22) Filed: Dec. 11, 2018

(65) Prior Publication Data

US 2020/0058710 A1    Feb. 20, 2020

(30) Foreign Application Priority Data

Aug. 16, 2018   (CN) .......................... 2018 1 0934002

(51) Int. Cl.
*H01L 27/32* (2006.01)
*H01L 51/00* (2006.01)

(52) U.S. Cl.
CPC ........ *H01L 27/323* (2013.01); *H01L 27/3276* (2013.01); *H01L 51/0097* (2013.01)

(58) Field of Classification Search
CPC ............... H01L 27/323; H01L 27/3276; H01L 51/0097; G06F 1/1652; G06F 2203/04102; G09G 2380/02
See application file for complete search history.

(56) References Cited

U.S. PATENT DOCUMENTS

2013/0300678 A1* 11/2013 Kang .................. G06F 3/044
345/173
2017/0212637 A1* 7/2017 Choi .................. G06F 1/1652

* cited by examiner

*Primary Examiner* — Kent W Chang
*Assistant Examiner* — Chayce R Bibbee
(74) *Attorney, Agent, or Firm* — Tarolli, Sundheim, Covell & Tummino LLP

(57) ABSTRACT

An organic light-emitting display panel and a display device are provided. The organic light-emitting display panel includes a bending axis, a bending region, a first non-bending region, a second non-bending region, and at least one set of touch traces. The bending axis extends in a first direction. The first non-bending region and the second non-bending region are respectively located at two opposite sides of the bending region in a second direction perpendicular to the first direction. The at least one set of touch traces includes a plurality of touch traces. In the bending region, the plurality of touch traces extends from the first non-bending region to the second non-bending region. In the bending region, an angle between each of the plurality of touch traces and the bending axis is not 90°.

18 Claims, 12 Drawing Sheets

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. 201810934002.6, filed on Aug. 16, 2018, the content of which is incorporated herein by reference in its entirety.

TECHNICAL FIELD

The present disclosure relates to the field of display technologies, and particularly, to an organic light-emitting display panel and a display device.

BACKGROUND

At present, display technologies have been applied to every aspect of people's daily life, and accordingly, more and more materials and technologies have been used for display screens. Nowadays, mainstream display screens mainly include liquid crystal display screens and organic light-emitting display panels. Due to the self-luminous performance of the organic light-emitting display panel, the most energy-consuming backlight module is omitted compared with the liquid crystal display, so that it has the advantage of better energy-saving. In addition, the organic light-emitting display panel also has the characteristics such as good flexibility and bendability. By using a flexible substrate, a plurality of conductive layers are sequentially formed on the flexible substrate, including a thin film transistor driving array layer, an anode layer, an organic light-emitting layer, a cathode layer, and a thin-film encapsulation layer, so that the organic light-emitting display panel has excellent bendability.

As the user's requirements on flexible bendability or folding performance of the display terminal product becomes more and more demanding, the stability of the performance of the flexible display product and the number of times of anti-bending are also required to be higher. In the related art, the organic light-emitting display panel includes a display region, a non-display region surrounding the display region, touch electrodes located in the display region, and a plurality of touch traces electrically connected to the touch electrodes. The plurality of touch traces extends from the display region to the non-display region, and further extends to the position where a driving chip is located in the non-display region, and is electrically connected to the driving chip. There is a bending region provided in a foldable organic light-emitting display panel. Some of the touch traces may pass through the bending region during extending in the non-display region. Since the bending region may be repeatedly bent in the organic light-emitting display panel, the portion of the touch traces in the bending region is easily broken, thereby adversely affecting the touch performance.

SUMMARY

In view of the above, the present disclosure provides an organic light-emitting display panel and a display device, which can reduce the probability of breakage of the touch trace in a bending region, thereby reducing the adverse effect on the touch performance.

In a first aspect of the present disclosure, an organic light-emitting display panel is provided. The organic light-emitting display panel includes a bending region having a bending axis extending in a first direction, a first non-bending region and a second non-bending region, wherein in a second direction perpendicular to the first direction, the first non-bending region and the second non-bending region are respectively located at two opposite sides of the bending region; and at least one set of touch traces comprising a plurality of touch traces, wherein in the bending region, the plurality of touch traces extends from the first non-bending region to the second non-bending region; wherein in the bending region, an angle between each of the plurality of touch traces and the bending axis is not 90°.

In a second aspect of the present disclosure, a display device is provided. The display device includes an organic light-emitting display panel, wherein the display panel includes: a bending region having a bending axis extending in a first direction, a first non-bending region and a second non-bending region, wherein in a second direction perpendicular to the first direction, the first non-bending region and the second non-bending region are respectively located at two opposite sides of the bending region; and at least one set of touch traces comprising a plurality of touch traces, wherein in the bending region, the plurality of touch traces extends from the first non-bending region to the second non-bending region; wherein in the bending region, an angle between each of the plurality of touch traces and the bending axis is not 90°.

BRIEF DESCRIPTION OF DRAWINGS

In order to explain the embodiments of the present disclosure or the technical solution in the related art, the drawings to be used in the description of the embodiments or the related art will be briefly described below. The drawings in the following description are only some embodiments of the present disclosure. For those skilled in the art, other drawings may also be obtained based on these drawings without paying any creative labor.

DESCRIPTION OF EMBODIMENTS

In order to make the objectives, technical solutions, and advantages of the present disclosure more apparent, the technical solutions of the present disclosure will be further clearly described by embodiments with reference to the accompanying drawings. The described embodiments are part of the embodiments of the present disclosure, but not all of the embodiments. Other embodiments obtained by those persons skilled in the art based on the embodiments of the present disclosure without creative efforts shall fall within the protection scope of the present disclosure.

The terms used in the embodiments of the present disclosure are merely for the purpose of describing specific embodiments, rather than limiting the present disclosure. The terms "a", "an", "the" and "said" in a singular form in the embodiment of the present disclosure and the attached claims are also intended to include plural forms thereof, unless noted otherwise.

In order to further illustrate the beneficial effects of the embodiments of the present disclosure, the problems in the related art are first introduced before describing the embodiments of the present disclosure.

Figure 1:
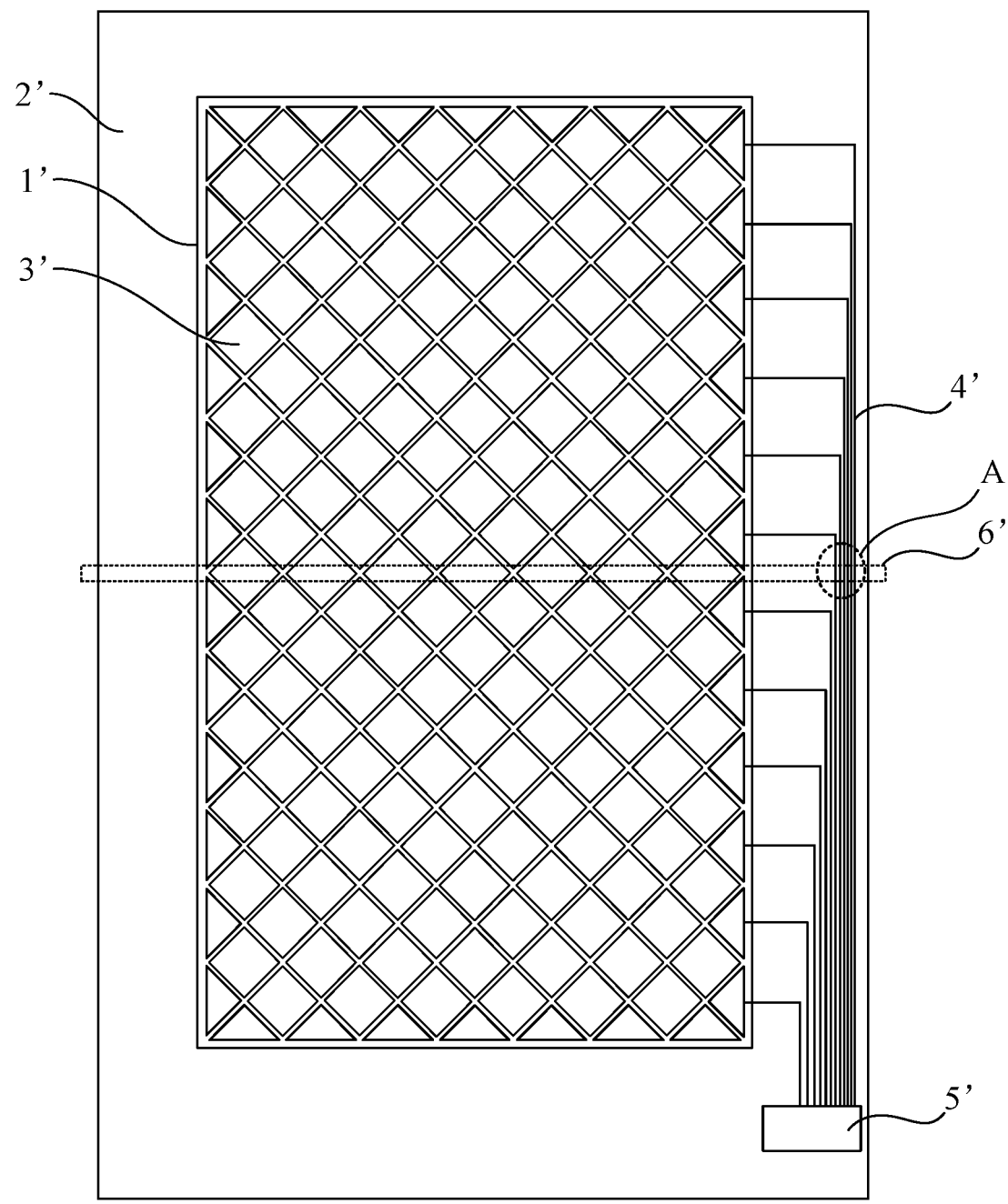
FIG. 1 is a structural schematic diagram showing an organic light-emitting display panel in the prior art.

FIG. 1 is a structural schematic diagram showing an organic light-emitting display panel in the related art. As shown in FIG. 1, the organic light-emitting display panel includes a display region 1', a non-display region 2' surrounding the display region 1', touch electrodes 3' located in the display region 1', and a plurality of touch traces 4' electrically connected to the touch electrodes 3'. The plurality of touch traces 4' extends from the display region 1' to the non-display region 2', and further extends to the position where a driving chip 5' is located in the non-display region 2', and is electrically connected to the driving chip 5'. There is a bending region 6' provided in a foldable organic light-emitting display panel. Some of the touch traces 4' may pass through the bending region 6' during extending in the non-display region 2'. Since the bending region 6' may be repeatedly bent in the organic light-emitting display panel, the portion of the touch traces 4' in the bending region 6' is easily broken, thereby adversely affecting the touch performance.

Figure 2:
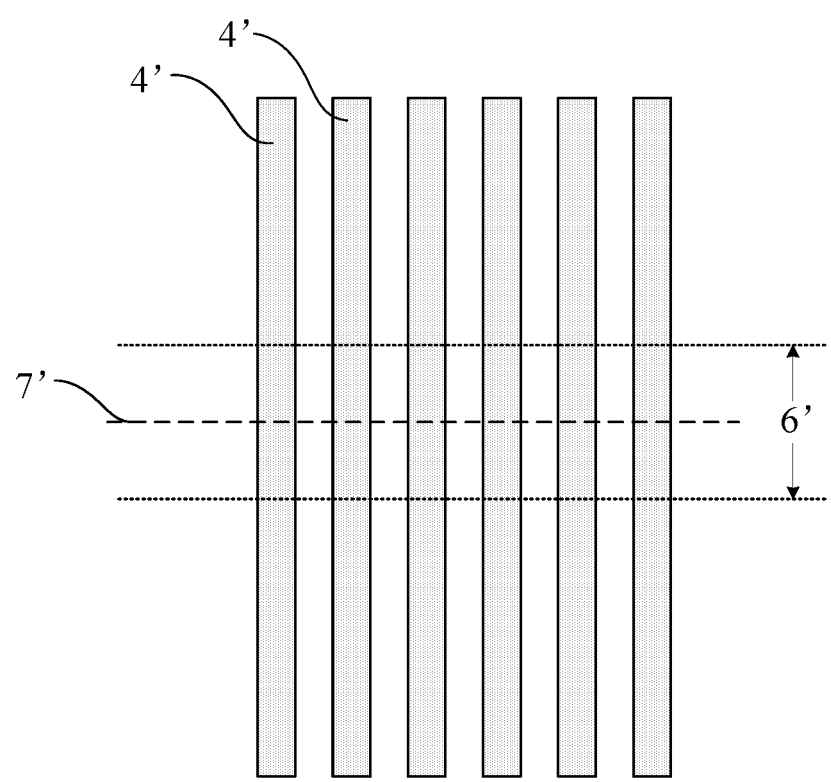
FIG. 2 is a partially enlarged schematic diagram showing a region A in FIG. 1.

As shown in FIGS. 1-2, FIG. 2 is a partially enlarged schematic diagram showing the region A in FIG. 1. An organic light-emitting display panel in the related art has a bending axis 7'. The organic light-emitting display panel may be repeatedly bent along the bending axis 7' during use. In the bending region 6', a plurality of touch traces 4' is perpendicular to the bending axis 7'. During a bending process of the organic light-emitting display panel, the stress in the plurality of touch traces 4' tends to concentrate in a certain place, which causes the touch traces 4' to be broken, thereby adversely affecting the touch performance.

Figure 3:
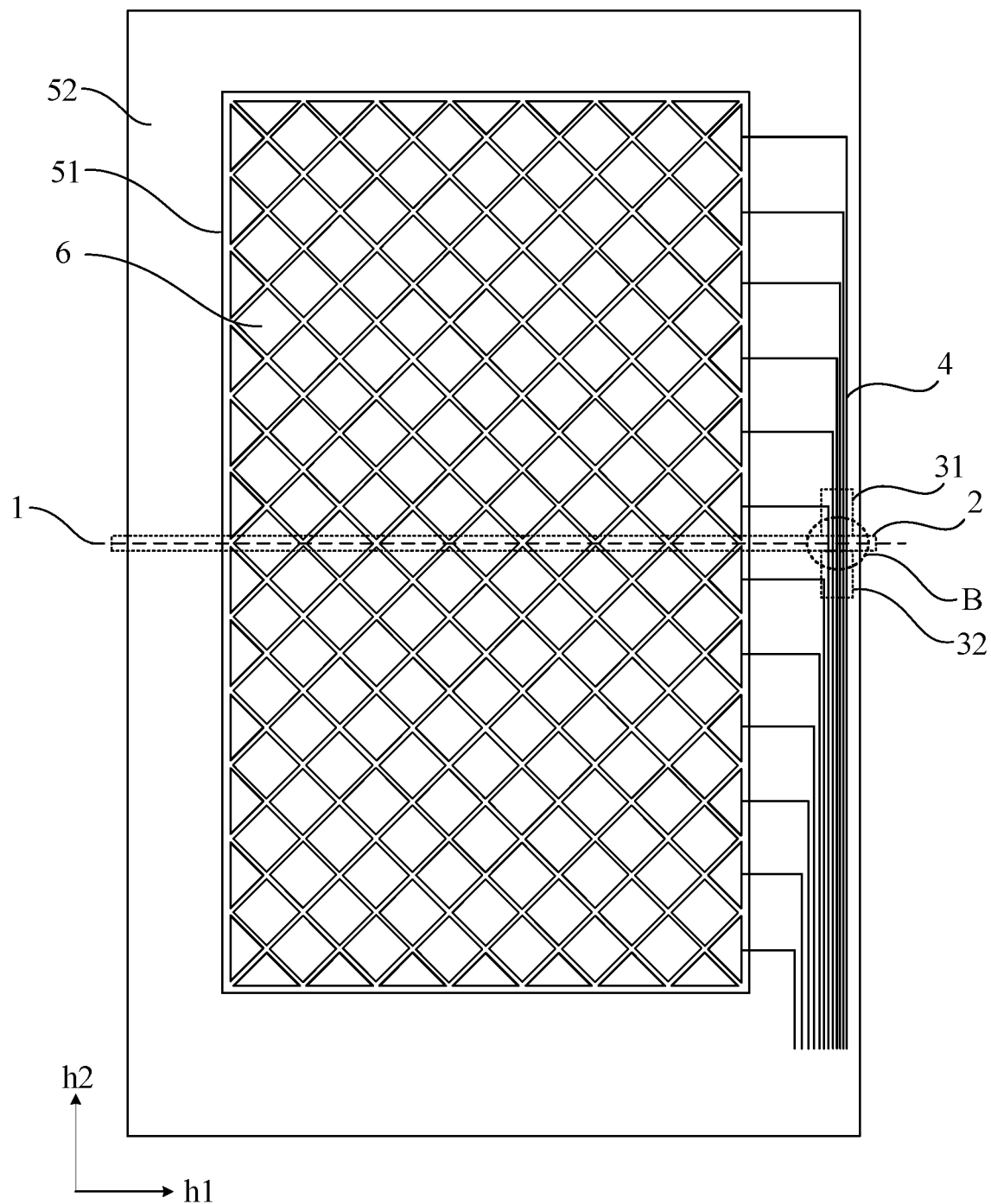
FIG. 3 is a structural schematic diagram showing an organic light-emitting display panel according to an embodiment of the present disclosure.
Figure 4:
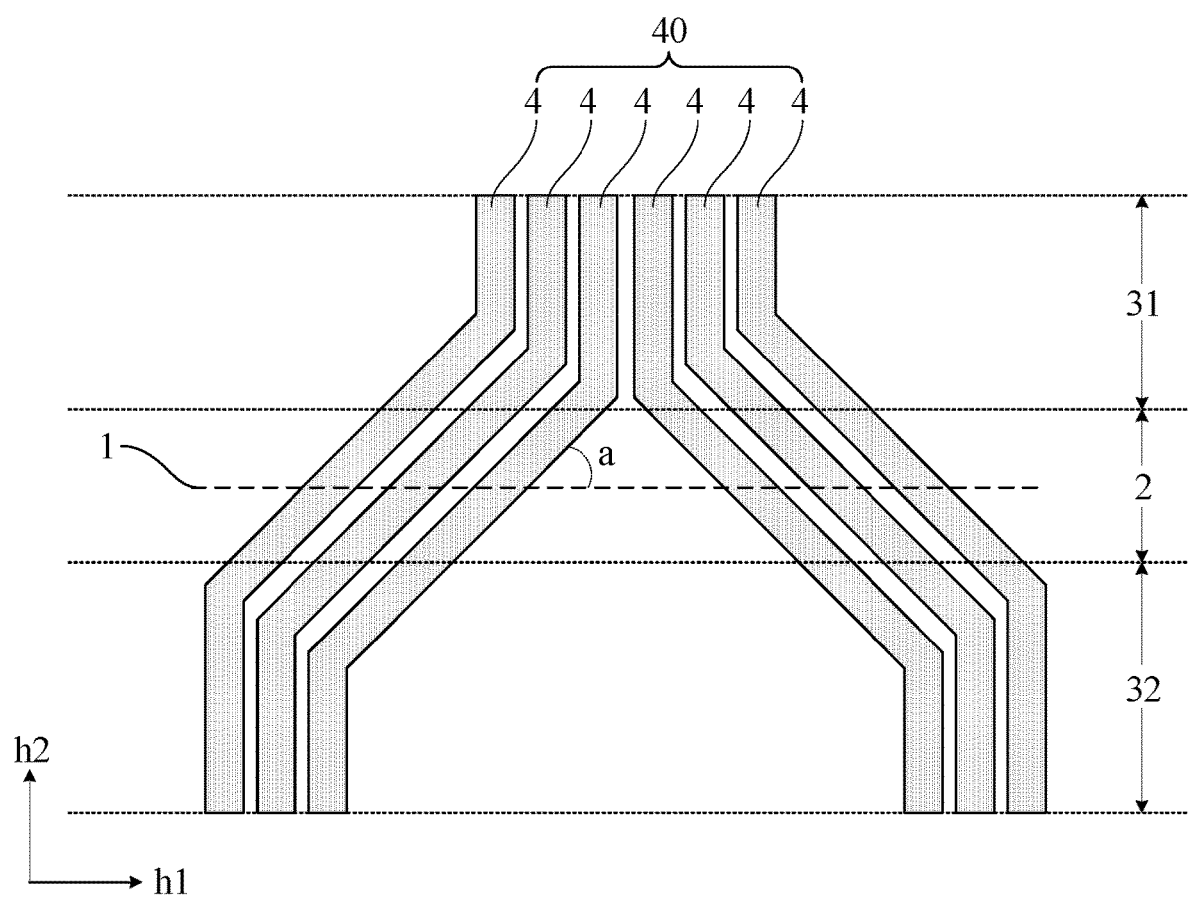
FIG. 4 is a partially enlarged schematic diagram showing a region B in FIG. 3.

As shown in FIGS. 3-4, FIG. 3 is a structural schematic diagram showing an organic light-emitting display panel according to an embodiment of the present disclosure, and FIG. 4 is a partially enlarged schematic diagram showing a region B in FIG. 3. The organic light-emitting display panel includes: a bending axis 1, a bending region 2, a first non-bending region 31, a second non-bending region 32, and at least one set of touch traces 40. The bending axis 1 extends in a first direction h1. The first non-bending region 31 and the second non-bending region 32 are respectively located at two opposite sides of the bending region 2 in a second direction h2 perpendicular to the first direction h1. The at least one set of touch traces 40 includes a plurality of touch traces 4. In the bending region 2, the plurality of touch traces 4 extends from the first non-bending region 31 to the second non-bending region 32. In the bend region 2, an angle a between the plurality of touch traces 4 and the bending axis 1 is not 90°, that is, the plurality of touch trace 4 is obliquely arranged relative to the bending axis 1 in the bending region 2.

During use, the organic light-emitting display panel may be repeatedly bent along the bending axis 1, and the bending region 2 is a region including the bending axis 1. During the bending process, the organic light-emitting display panel is in a bending state in the bending region 2, and is in a non-bending state in the first non-bending region 31 and the second non-bending region 32. For example, the organic light-emitting display panel includes a display region 51 and a non-display region 52 surrounding the display region 51. Touch electrodes 6 are arranged in the display region 51. The plurality of touch traces 4 connected to the corresponding touch electrodes 6 extends in the non-display region 52 to a position where a driving chip (not shown in FIG. 3) is located, and is connected to the driving chip so as to realize an electrical connection between the driving chip and the touch electrodes 6.

With the organic light-emitting display panel according to the embodiments of the present disclosure, since an angle between the plurality of touch traces and the bending axis is not 90° in the bending region, the stress on the plurality of touch traces is more easily released during a bending process of the organic light-emitting display panel so that the probability of breakage of the plurality of touch traces in the bending region is reduced, thereby reducing the adverse effect on the touch performance.

In an embodiment, in the bending region 2, the angle a between the plurality of touch traces 4 and the bending axis 1 satisfies 25°≤a≤45°.

On the one hand, the smaller the angle a between the plurality of touch traces 4 and the bending axis 1 is, the better the anti-bending performance of the touch trace 4 is. However, on the other hand, the smaller the angle a between the plurality of touch traces 4 and the bending axis 1 is, the larger the space occupied by the plurality of touch traces 4 in the first direction h1 is, which is disadvantageous for implementation of a narrow border of the organic light-emitting display panel. Therefore, considering the above two aspects, it is determined that the angle a between the plurality of touch traces 4 and the bending axis 1 satisfies 25°≤a≤45°.

Figure 5:
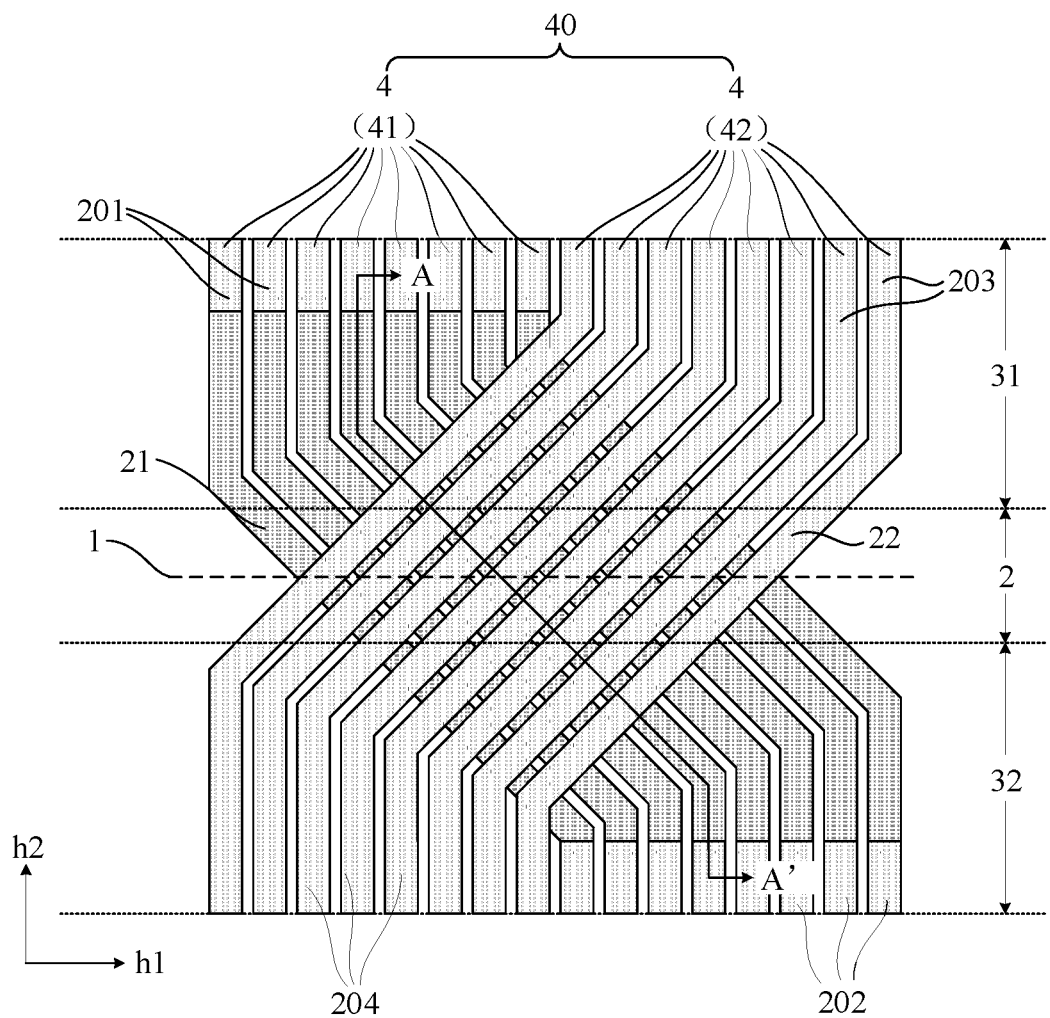
FIG. 5 is a partially enlarged schematic diagram showing another display panel according to an embodiment of the present disclosure.

As shown in FIG. 5, FIG. 5 is a partially enlarged schematic diagram showing another display panel according to an embodiment of the present disclosure. In an embodiment, in the at least one set of touch traces 40, the plurality of touch trace 4 includes a plurality of first touch traces 41 and a plurality of second touch traces 42. In the at least one set of touch traces 40, at least one of the plurality of first touch traces 41 and at least one of the plurality of second touch traces 42 intersect in an insulation manner in the bending region 2.

Since the touch trace 4 is arranged by being perpendicular to the bending axis 1 in the bending region 2, the space occupation in the first direction h1 is increased. Therefore, when a plurality of touch traces 4 is provided, the plurality of first touch traces 41 and the plurality of second touch traces 42 intersect in an insulation manner, so that the space occupation of the plurality of touch traces 4 in the first direction h1 can be reduced to facilitate the implementation of the narrow border.

In an embodiment, in the at least one set of touch traces 40, the plurality of first touch traces 41 is arranged adjacent to each other in the first non-bending region 31, and the plurality of second touch traces 42 is arranged adjacent to each other in the first non-bending region 31. In the at least one set of touch traces 40, the plurality of first touch traces 41 is arranged adjacent to each other in the second non-bending region 32, and the plurality of second touch traces 42 is arranged adjacent to each other in the second non-bending region 32. In the at least one set of touch traces 40, each of the plurality of first touch traces 41 and each of the plurality of second touch traces 42 intersect in an insulation manner in the bending region 2. Since a large number of touch traces 4 is provided, such a structure can make full use of space.

Figure 6:
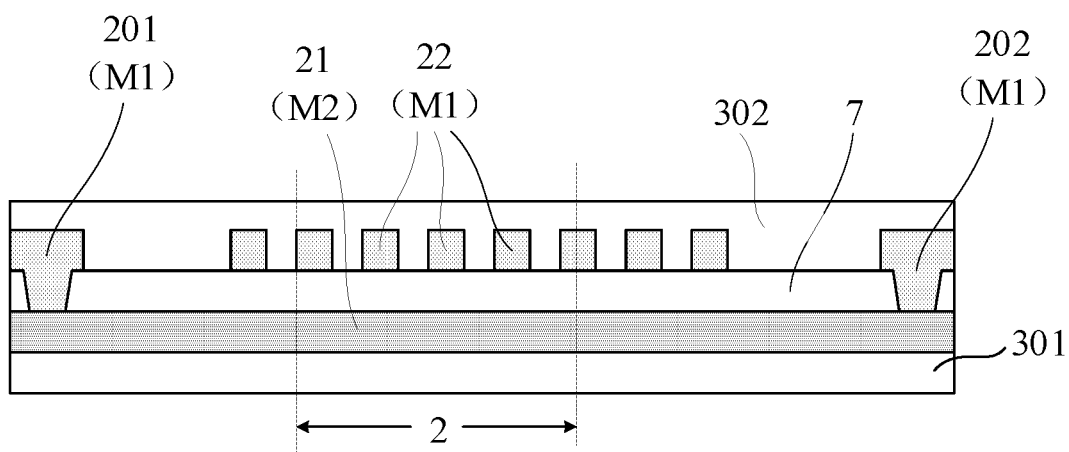
FIG. 6 is a cross-sectional view taken along line AA' in FIG. 5.

As shown in FIGS. 5-6, FIG. 6 is a cross-sectional view taken along line AA' in FIG. 5. In an embodiment, the organic light-emitting display panel includes: a first metal layer M1, a second metal layer M2, and an insulation layer 7. The insulation layer 7 is located between the first metal layer M1 and the second metal layer M2. Each of the plurality of first touch traces 41 includes a first intersection portion 21 located in the bending region 2. The first intersection portion 21 is located in the second metal layer M2. Each of the plurality of second touch traces 42 includes a second intersection portion 22 located in the bending region 2, and the second intersection portion 22 is located in the first metal layer M1. In the bending region 2, the plurality of first touch traces 41 each includes a first intersection portion 21 in the second metal layer M2, and the plurality of second touch traces 42 each includes a second intersection portion 22 in the first metal layer M1, so that the plurality of first touch traces 41 and the plurality of second touch traces 42 can intersect in an insulation manner in the bending region 2. The organic light-emitting display panel further includes a first base layer 301 and a second base layer 302 respectively provided at the top and bottom of the structure, respectively.

In an embodiment, in the at least one set of touch traces 40, each of the plurality of first touch traces 41 further includes a first trace portion 201 located in the first non-bending region 31, the first trace portion 201 is located in the first metal layer M1, and the first trace portion 201 is electrically connected to the first intersection portion 21 through a via hole on the insulation layer 7. In the at least one set of touch traces 40, each of the plurality of first touch traces 41 further includes a second trace portion 202 located in the second non-bending region 32, the second trace portion 202 is located in the first metal layer M1, and the second trace portion 202 is electrically connected to the first intersection portion 21 through a via hole on the insulation layer 7. Each of the plurality of second touch traces 42 is located in the first metal layer M1.

In the bending region 2, the plurality of first touch traces 41 and the plurality of second touch traces 42 are required to intersect in an insulation manner. Therefore the first intersection portion 21 and the second intersection portion 22 are respectively located in different metal layers. In the non-bending region 31 and the second non-bending region 32, the plurality of first touch traces 41 and the plurality of second touch traces 42 can be in a same metal layer. In this way, the respective touch traces 4 will not overlap in the non-bending region, so that the coupling effect due to overlapping between different touch traces 4 can be reduced.

In an embodiment, in the at least one set of touch traces 40, a number of the plurality of first touch traces 41 is equal to a number of the plurality of second touch traces 42. In this way, the space utilization rate of the touch traces 4 in the first direction h1 can be further increased, thereby facilitating the design of the narrow frame.

In an embodiment, in the at least one set of touch traces 40, each of the plurality of second touch traces 42 includes a third trace portion 203 located in the first non-bending region 31 and a fourth trace portion 204 located in the second non-bending region 32. In the at least one set of touch traces 40, the plurality of first trace portions 201 and the plurality of fourth trace portions 204 have a one-to-one correspondence, and each of the first trace portions 201 and the corresponding one of the fourth trace portions 204 extend along a same straight line. In the at least one set of touch traces, the plurality of second trace portions 202 and the plurality of third trace portions 203 have a one-to-one correspondence, and each of the second trace portions 202 and the corresponding one of the third trace portions 203 extend along a same straight line. In this way, the space utilization rate of the touch traces 4 in the first direction h1 can be further increased, thereby facilitating the design of the narrow frame.

Figure 7:
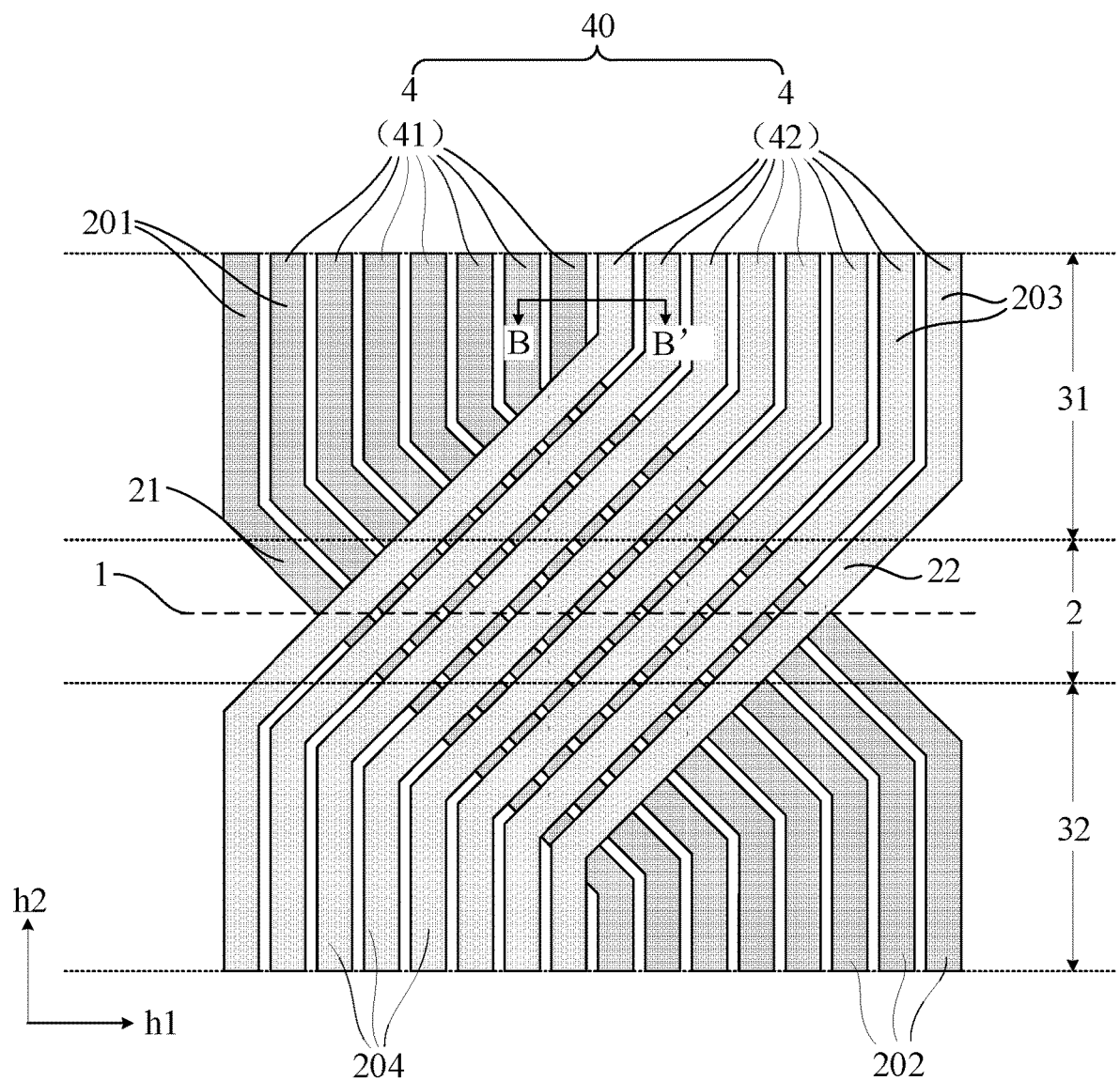
FIG. 7 is a partially enlarged schematic diagram showing another display panel according to an embodiment of the present disclosure.
Figure 8:
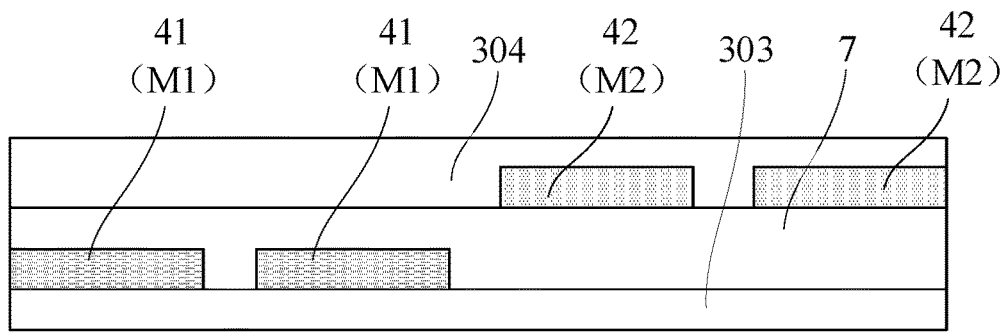
FIG. 8 is a cross-sectional view taken along line BB' in FIG. 7.

As shown in FIGS. 7-8, FIG. 7 is a partially enlarged schematic diagram showing another display panel according to an embodiment of the present disclosure, and FIG. 8 is a cross-sectional view taken along line BB' in FIG. 7. In an embodiment, the organic light-emitting display panel includes a first metal layer M1, a second metal layer M2, and an insulation layer 7. The insulation layer 7 is located between the first metal layer M1 and the second metal layer M2. Each of the plurality of first touch traces 41 is located in the first metal layer M1. Each of the plurality of second touch traces 42 is located in the second metal layer M2. In the first non-bending region 31 and the second non-bending region 32, any one of the first touch traces 41 and any one of the second touch traces 42 do not overlap in a direction perpendicular to a plane where the organic light-emitting display panel is located. In this way, the respective touch traces 4 will not overlap in the non-bending region, so that the coupling effect due to overlapping between the different touch traces 4 can be reduced. The organic light-emitting display panel further includes a third base layer 303 and a fourth base layer 304 respectively provided at the top and bottom of the structure, respectively.

Figure 9:
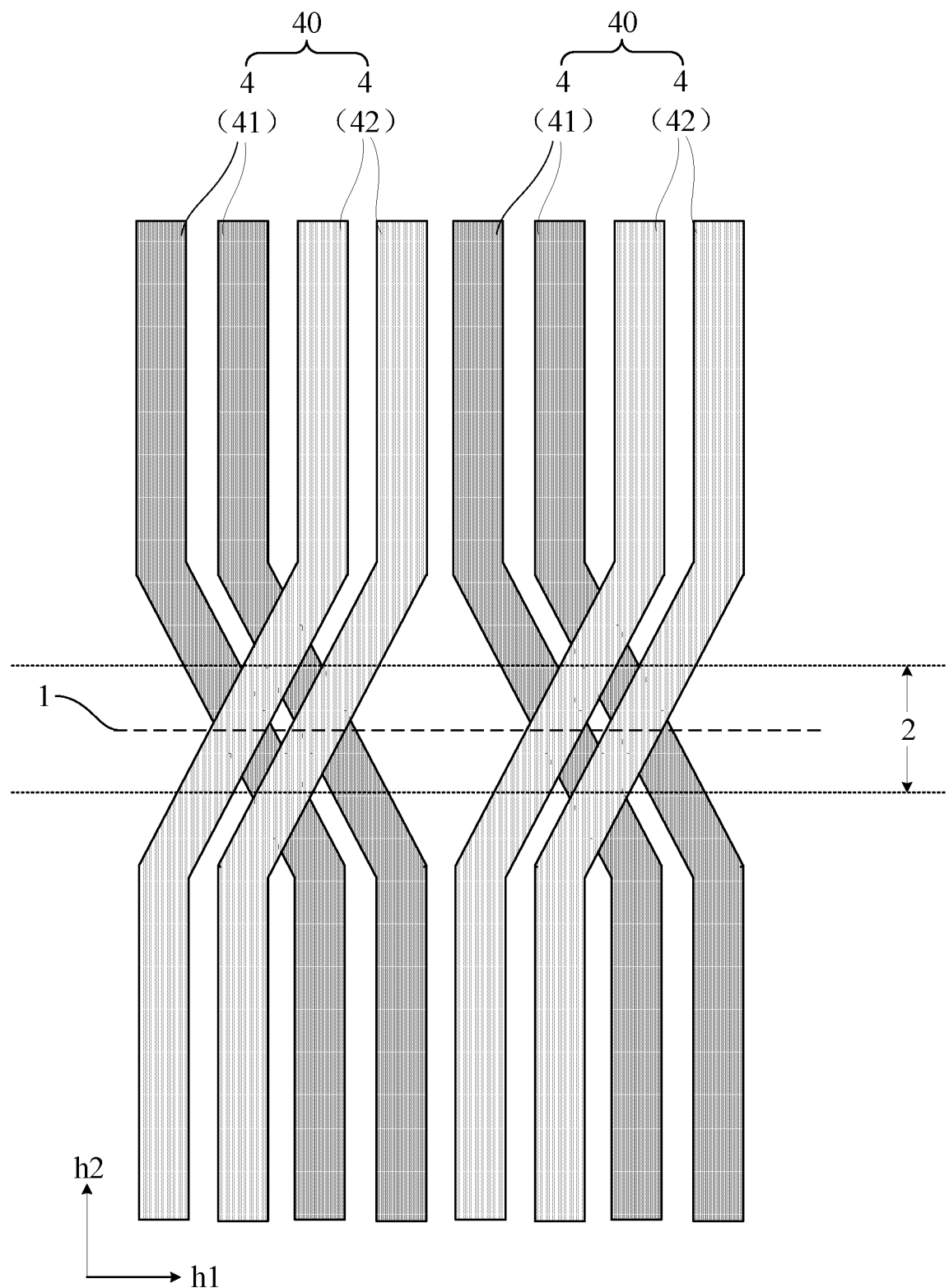
FIG. 9 is a partially enlarged schematic diagram showing another display panel according to an embodiment of the present disclosure.

As shown in FIG. 9, FIG. 9 is a partially enlarged schematic diagram showing another display panel according to an embodiment of the present disclosure. More than one at least one set of touch traces 40 are provided and arranged along the first direction h1.

In each of the multiple sets of touch traces 40, the plurality of first touch traces 41 and the plurality of second touch traces 42 intersect in an insulation manner. In the bending region 2, the greater the angle between the plurality of touch traces 4 and the bending axis 1 is, the better the bending performance is, but the larger the space occupation in the first direction h1 is. In order to balancing the above two aspects, the plurality of sets of touch traces 40 is set, so that the angle between the plurality of touch traces 4 and the bending axis 1 can be balanced with the space occupied by the touch trace 4 in the first direction h1.

Figure 10:
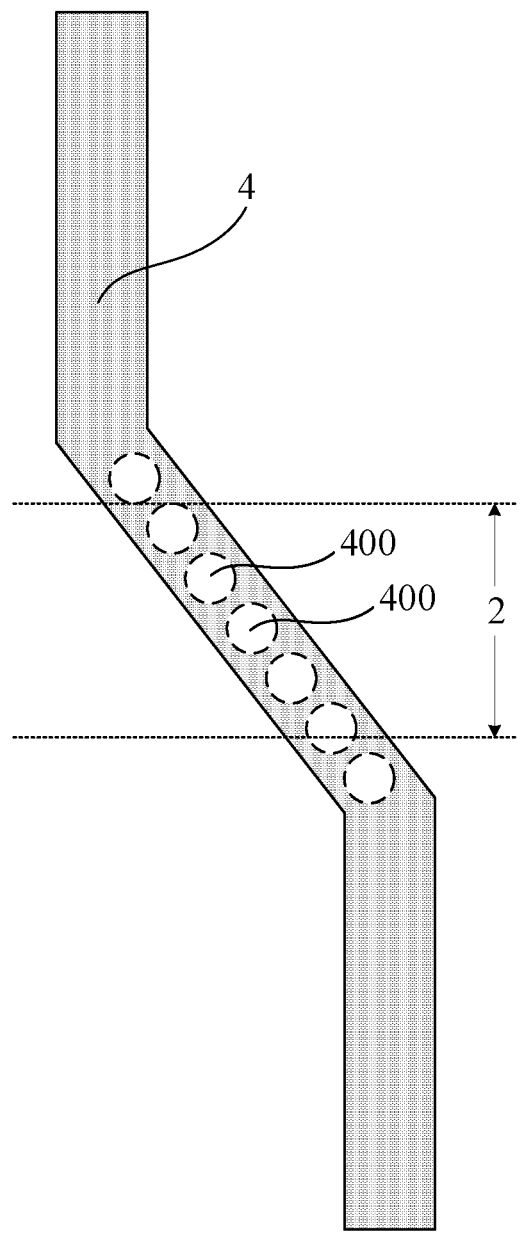
FIG. 10 is a partially enlarged schematic diagram showing a touch trace according to an embodiment of the present disclosure.

As shown in FIG. 10, FIG. 10 is a partially enlarged schematic diagram showing a touch trace according to an embodiment of the present disclosure. In an embodiment, in the bending region 2, the plurality of touch traces 4 has a plurality of hollow portions 400 arranged along an extending direction of the plurality of touch traces 4. The touch trace 4 having a hollow structure can further reduce the probability of the disconnection of the touch trace 4 during the bending process.

Figure 11:
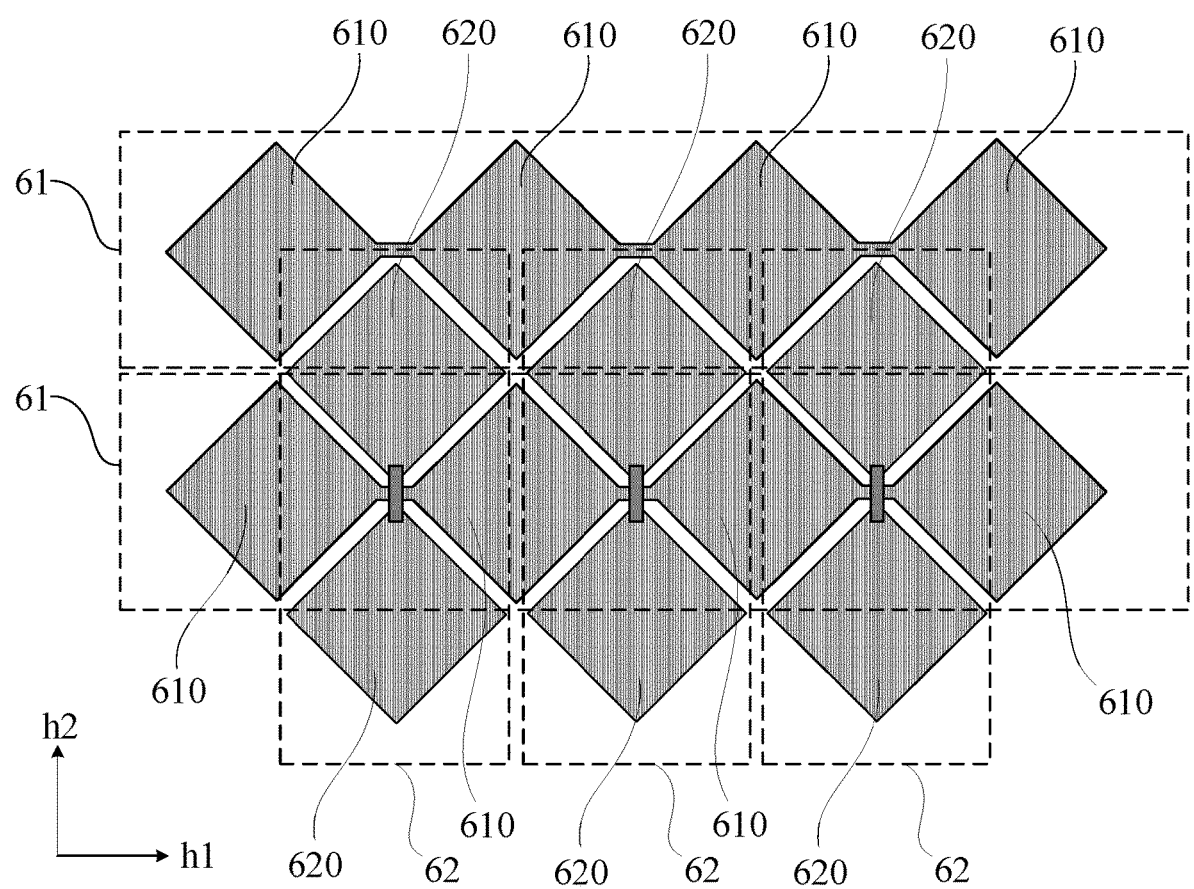
FIG. 11 is a partially enlarged schematic diagram of a display region in a display panel according to an embodiment of the present disclosure.

FIG. 11 is a partially enlarged schematic diagram of a display region in a display panel according to an embodiment of the present disclosure. In an embodiment, the organic light-emitting display panel includes a plurality of driving electrodes 61 and a plurality of sensing electrodes 62 located in the display region. Each of the plurality of touch traces is electrically connected to the corresponding driving electrode 61 or the corresponding sensing electrode 62.

In an embodiment, each of the plurality of driving electrodes 61 includes a plurality of electrode blocks having a diamond shape arranged in the first direction h1. In each of the plurality of driving electrodes 61, any two adjacent electrode blocks are connected to each other by a material in a same layer, and the plurality of driving electrodes 61 is arranged in the second direction h2. Each of the plurality of sensing electrodes 62 includes a plurality of electrode blocks having a diamond shape arranged in the second direction h2. In each of the plurality of sensing electrodes 62, any two adjacent electrode blocks are bridged by the other layers, and the plurality of sensing electrodes 62 is arranged in the second direction h2. The electrode blocks in the driving electrode 61 and the sensing electrode 62 may be formed of the Indium Tin Oxide (ITO) material in a same layer.

Figure 12:
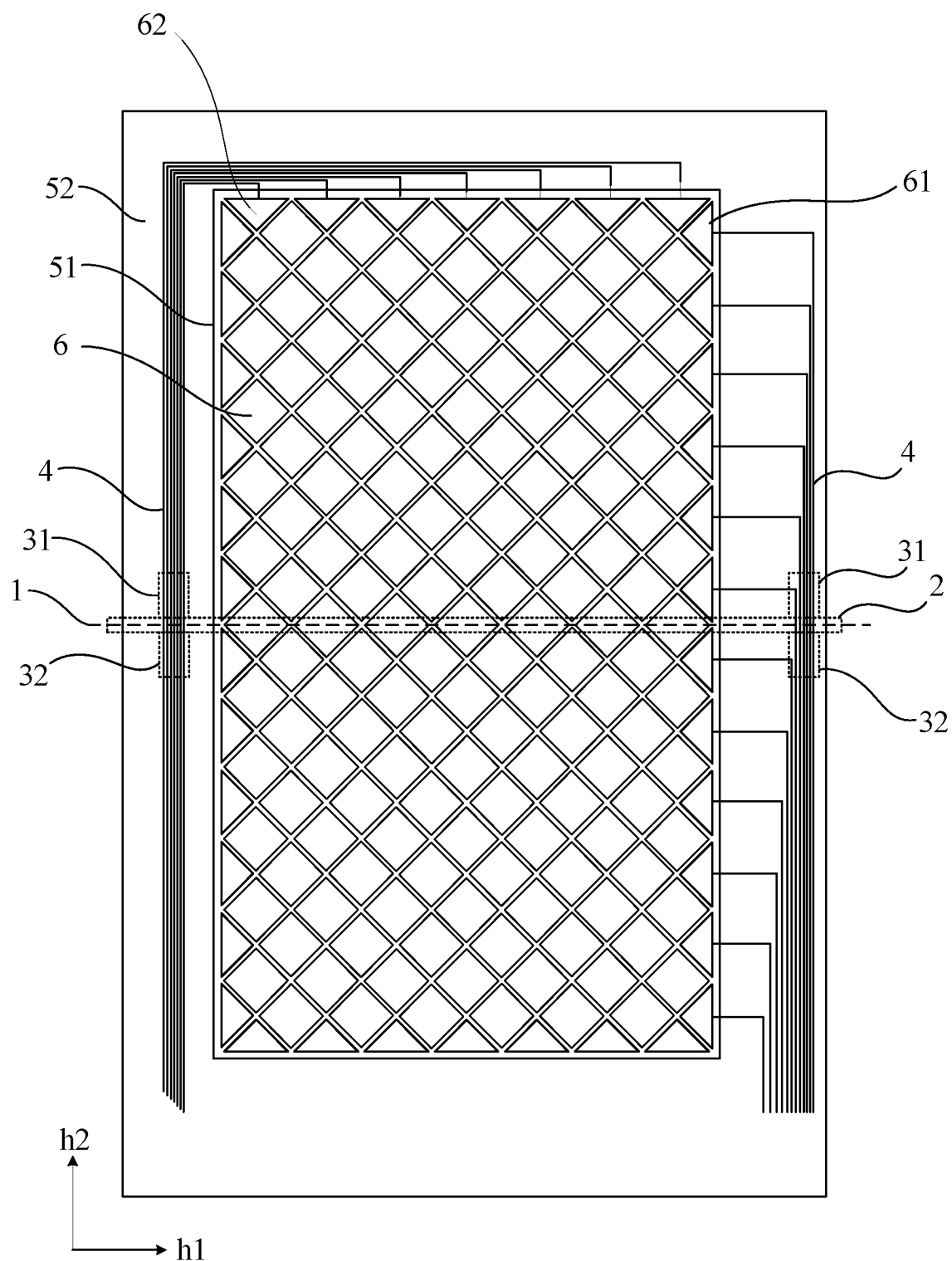
FIG. 12 is a structural schematic diagram showing another organic light-emitting display panel according to an embodiment of the present disclosure.
Figure 13:
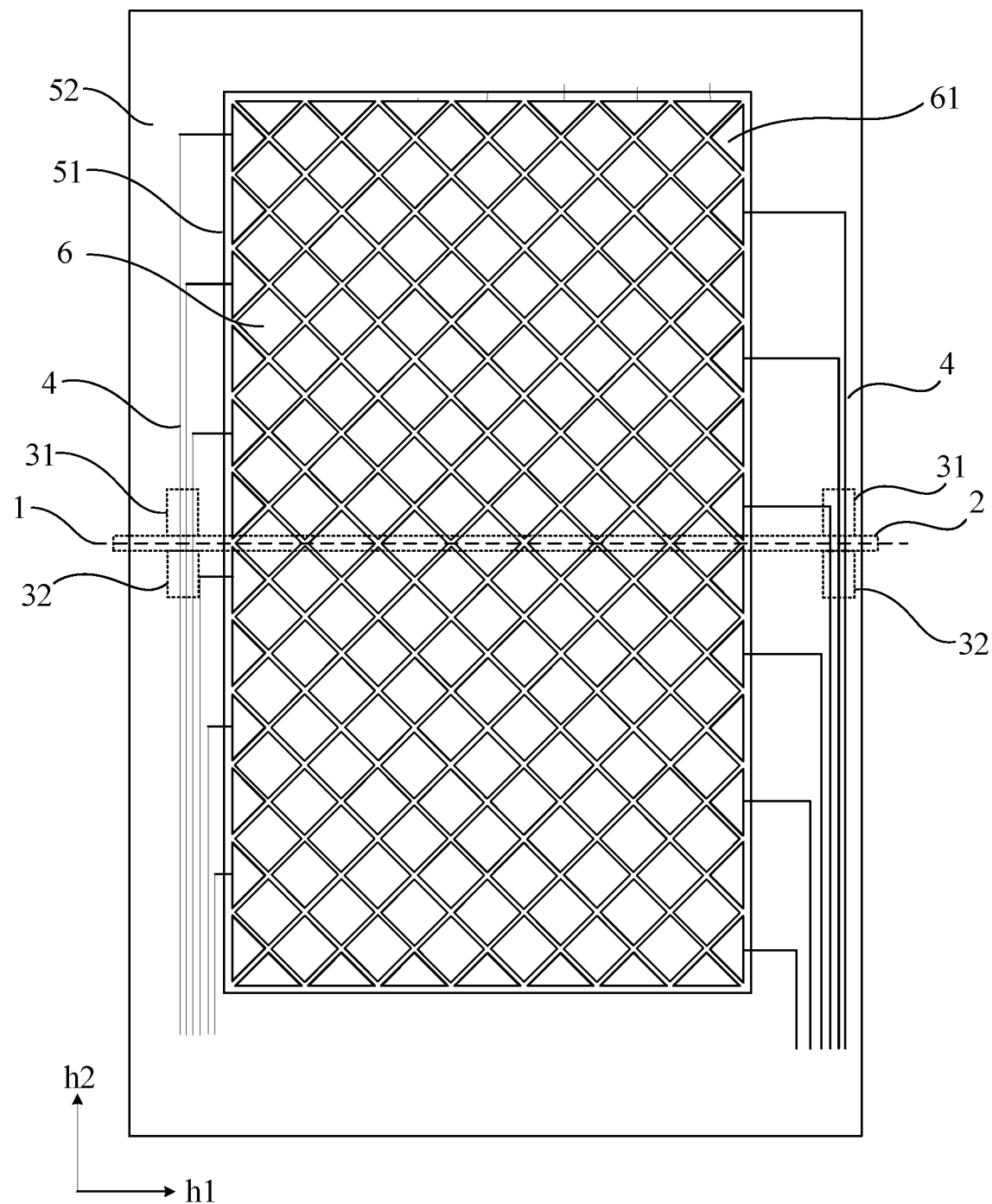
FIG. 13 is a structural schematic diagram showing another organic light-emitting display panel according to an embodiment of the present disclosure.

In addition, only the structure in which the plurality of touch traces 4 is located in the right side of the display region 51 is illustrated in FIG. 3. However, the setting manner for the plurality of touch traces 4 is not limited in the embodiments of the present disclosure. In an embodiment, as shown in FIGS. 12-13, FIGS. 12 and 13 are structural schematic diagrams showing two other organic light-emitting display panels according to embodiments of the present disclosure. In FIG. 12, a plurality of columns of the sensing electrodes 62 arranged in the first direction h1 is connected to the plurality of touch traces 4 at an upper side of the display region 51. These touch traces 4 extend from the left side of the display region 51 to the lower side of the display region 51 in order to facilitate connection of the plurality of driving chips. A plurality of rows of the driving electrodes 61 arranged in the second direction h2 is connected to the plurality of touch traces 4 at a right side of the display region 51. These touch traces 4 extend from the right side of the display region 51 to the lower side of the display region 51 in order to facilitate connection of the plurality of driving chips. Only the arrangement manner in which the plurality of touch traces 4 corresponding to the driving electrode 61 extends to the lower side of the display region 51 is illustrated in FIG. 13. The odd rows of driving electrodes 61 extend to the lower side of the display region 51 from the left side of the display region 51. The even rows of driving electrodes 61 extend to the lower side of the display region 51 from the right side of the display region 51. No matter which side of the display region 51 the touch trace 4 is located, as long as the plurality of touch trace 4 passes through the bending region 2, the above technical solution can be applied. In the bending region 2, an angle between the plurality of touch traces 4 and the bending axis 1 is not 90°.

Figure 14:
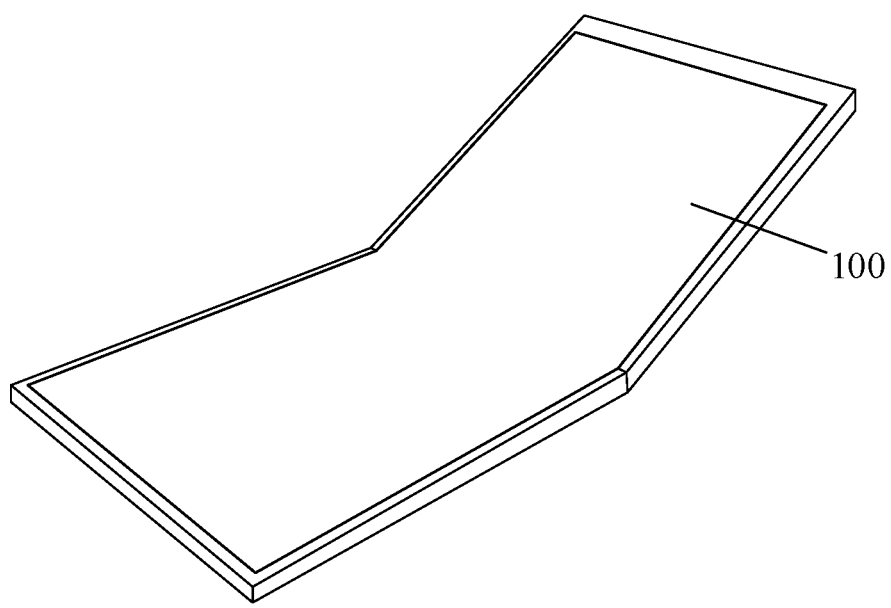
FIG. 14 is a structural schematic diagram showing a display device according to an embodiment of the present disclosure.

As shown in FIG. 14, FIG. 14 is a structural schematic diagram showing a display device according to an embodiment of the present disclosure. The display device in the embodiments of the present disclosure includes the organic light-emitting display panel 100 described above.

The specific structure and principle of the organic light-emitting display panel 100 are the same as those of the foregoing embodiments, which are not elaborated herein. The display device may be any electronic device having a display function such as a touch display screen, a mobile phone, a tablet computer, a laptop computer, an electronic paper book, or a television.

With the display device according to the embodiments of the present disclosure, since an angle between the plurality of touch traces and the bending axis is not 90° in the bending region, the stress on the plurality of touch traces is more easily released during a bending process of the organic light-emitting display panel so that the probability of breakage of the plurality of touch traces in the bending region is reduced, thereby reducing the adverse effect on the touch performance.

Finally, it should be noted that the above embodiments are merely illustrative of the technical solutions of the present disclosure, and are not limited thereto. Although the present disclosure has been described in detail with reference to the foregoing embodiments, those skilled in the art will understand that the technical solutions described in the foregoing embodiments may be modified, or some or all of the technical features may be equivalently substituted. The modifications or substitutions do not make the essence of the corresponding technical solutions deviate from the scope of the technical solutions of the embodiments of the present disclosure.

What is claimed is:

1. An organic light-emitting display panel, comprising:
a bending region having a bending axis extending in a first direction, a first non-bending region and a second non-bending region, wherein in a second direction perpendicular to the first direction, the first non-bending region and the second non-bending region are respectively located at two opposite sides of the bending region; and
at least one set of touch traces comprising a plurality of touch traces, wherein in the bending region, the plurality of touch traces extends from the first non-bending region to the second non-bending region;
wherein in the bending region, an angle a between each of the plurality of touch traces and the bending axis is not 90°,
wherein in the at least one set of touch traces, the plurality of touch traces comprises a plurality of first touch traces and a plurality of second touch traces, and
in the at least one set of touch traces, at least one of the plurality of first touch traces and at least one of the plurality of second touch traces intersect in an insulation manner in the bending region, and overlap with each other in the bending region in a direction perpendicular to a plane where the organic light-emitting display panel is located.

2. The organic light-emitting display panel according to claim 1, wherein
in the bending region, the angle a between each of the plurality of touch traces and the bending axis satisfies $25° \leq a \leq 45°$.

3. The organic light-emitting display panel according to claim 1, wherein
in the at least one set of touch traces, the plurality of first touch traces is arranged adjacent to each other in the first non-bending region, and the plurality of second touch traces is arranged adjacent to each other in the first non-bending region;
in the at least one set of touch traces, the plurality of first touch traces is arranged adjacent to each other in the second non-bending region, and the plurality of second touch traces is arranged adjacent to each other in the second non-bending region; and
in the at least one set of touch traces, each of the plurality of first touch traces and each of the plurality of second touch traces intersect with each other in an insulation manner in the bending region.

4. The organic light-emitting display panel according to claim 3, further comprising:
a first metal layer,
a second metal layer, and
an insulation layer located between the first metal layer and the second metal layer,
wherein each of the plurality of first touch traces comprises a first intersection portion located in the bending region, and the first intersection portion is located in the second metal layer, and each of the plurality of second touch traces comprises a second intersection portion located in the bending region, and the second intersection portion is located in the first metal layer.

5. The organic light-emitting display panel according to claim 4, wherein
in the at least one set of touch traces, each of the plurality of first touch traces further comprises a first trace portion located in the first non-bending region, the first trace portion is located in the first metal layer, and the first trace portion is electrically connected to the first intersection portion through a via hole in the insulation layer;
in the at least one set of touch traces, each of the plurality of first touch traces further comprises a second trace portion located in the second non-bending region, the second trace portion is located in the first metal layer, and the second trace portion is electrically connected to the first intersection portion through a via hole in the insulation layer; and
each of the plurality of second touch traces is located in the first metal layer.

6. The organic light-emitting display panel according to claim 5, wherein
in the at least one set of touch traces, a number of the plurality of first touch traces is equal to a number of the plurality of second touch traces.

7. The organic light-emitting display panel according to claim 6, wherein
in the at least one set of touch traces, each of the plurality of second touch traces comprises a third trace portion located in the first non-bending region and a fourth trace portion located in the second non-bending region;
in the at least one set of touch traces, the first trace portions and the fourth trace portions have a one-to-one correspondence, and each of the first trace portions and a corresponding one of the fourth trace portions extend along a same straight line; and
in the at least one set of touch traces, the second trace portions and the third trace portions have a one-to-one correspondence, and each of the second trace portions and a corresponding one of the third trace portions extend along a same straight line.

8. The organic light-emitting display panel according to claim 1, further comprising:
a first metal layer,
a second metal layer, and
an insulation layer located between the first metal layer and the second metal layer;
wherein each of the plurality of first touch traces is located in the first metal layer, and each of the plurality of second touch traces is located in the second metal layer; and
in the first non-bending region and the second non-bending region, any one of the plurality of first touch traces and any one of the plurality of second touch traces do not overlap with each other in a direction perpendicular to a plane where the organic light-emitting display panel is located.

9. The organic light-emitting display panel according to claim 1, wherein
multiple sets of touch traces are provided, and the multiple sets of touch traces are arranged along the first direction.

10. The organic light-emitting display panel according to claim 1, wherein
in the bending region, at least one touch trace of the plurality of touch traces has a plurality of hollow portions arranged along an extending direction of the at least one touch trace.

11. The organic light-emitting display panel according to claim 1, further comprising:
a display region;
a plurality of driving electrodes and a plurality of sensing electrodes located in the display region; and
each of the plurality of touch traces is electrically connected to a corresponding one of the driving electrodes or a corresponding one of the sensing electrodes.

12. A display device comprising an organic light-emitting display panel, wherein the organic light-emitting display panel comprises:
a bending region having a bending axis extending in a first direction, a first non-bending region and a second non-bending region, wherein in a second direction perpendicular to the first direction, the first non-bending region and the second non-bending region are respectively located at two opposite sides of the bending region; and
at least one set of touch traces comprising a plurality of touch traces, wherein in the bending region, the plurality of touch traces extends from the first non-bending region to the second non-bending region;
wherein in the bending region, an angle a between each of the plurality of touch traces and the bending axis is not 90°,
wherein in the at least one set of touch traces, the plurality of touch traces comprises a plurality of first touch traces and a plurality of second touch traces, and
in the at least one set of touch traces, at least one of the plurality of first touch traces and at least one of the plurality of second touch traces intersect in an insulation manner in the bending region, and overlap with each other in the bending region in a direction perpendicular to a plane where the organic light-emitting display panel is located.

13. The display device according to claim 12, wherein in the bending region, the angle a between each of the plurality of touch traces and the bending axis satisfies $25°≤a≤45°$.

14. The display device according to claim 12, wherein
in the at least one set of touch traces, the plurality of first touch traces is arranged adjacent to each other in the first non-bending region, and the plurality of second touch traces is arranged adjacent to each other in the first non-bending region;
in the at least one set of touch traces, the plurality of first touch traces is arranged adjacent to each other in the second non-bending region, and the plurality of second touch traces is arranged adjacent to each other in the second non-bending region; and
in the at least one set of touch traces, each of the plurality of first touch traces and each of the plurality of second touch traces intersect with each other in an insulation manner in the bending region.

15. The display device according to claim 14, wherein the display panel further comprises:
a first metal layer,
a second metal layer, and
an insulation layer located between the first metal layer and the second metal layer,
wherein each of the plurality of first touch traces comprises a first intersection portion located in the bending region, and the first intersection portion is located in the second metal layer, and each of the plurality of second touch traces comprises a second intersection portion located in the bending region, and the second intersection portion is located in the first metal layer.

16. The display device according to claim 15, wherein
in the at least one set of touch traces, each of the plurality of first touch traces further comprises a first trace portion located in the first non-bending region, the first trace portion is located in the first metal layer, and the first trace portion is electrically connected to the first intersection portion through a via hole in the insulation layer;
in the at least one set of touch traces, each of the plurality of first touch traces further comprises a second trace portion located in the second non-bending region, the second trace portion is located in the first metal layer, and the second trace portion is electrically connected to the first intersection portion through a via hole in the insulation layer; and
each of the plurality of second touch traces is located in the first metal layer.

17. The display device according to claim 12, wherein the display panel further comprises:
a first metal layer,
a second metal layer, and
an insulation layer located between the first metal layer and the second metal layer;
wherein each of the plurality of first touch traces is located in the first metal layer, and each of the plurality of second touch traces is located in the second metal layer; and
in the first non-bending region and the second non-bending region, any one of the plurality of first touch traces and any one of the plurality of second touch traces do not overlap with each other in a direction perpendicular to a plane where the organic light-emitting display panel is located.

18. The display device according to claim 12, wherein
in the bending region, at least one touch trace of the plurality of touch traces has a plurality of hollow portions arranged along an extending direction of the at least one touch trace.

* * * * *